US006344749B1

(12) United States Patent
Williams

(10) Patent No.: US 6,344,749 B1
(45) Date of Patent: Feb. 5, 2002

(54) TEST SYSTEM FOR MEASURING FREQUENCY RESPONSE AND DYNAMIC RANGE ON CABLE PLANT

(76) Inventor: Thomas H. Williams, 6423 Fairways Dr., Longmont, CO (US) 80503-8321

( * ) Notice: Subject to any disclaimer, the term of this patent is extended or adjusted under 35 U.S.C. 154(b) by 0 days.

(21) Appl. No.: 08/999,912

(22) Filed: Dec. 6, 1997

Related U.S. Application Data

(63) Continuation-in-part of application No. 08/865,237, filed on May 29, 1997, now Pat. No. 5,990,687.

(51) Int. Cl.[7] .............................................. G01R 27/00
(52) U.S. Cl. ....................... 324/620; 324/628; 375/224; 375/227; 702/75; 702/108
(58) Field of Search .................... 324/529, 96, 620, 324/628; 375/224, 227, 254, 296, 346, 350; 702/58, 59, 75, 76, 108, 109, 110, 117, 122, 124, 126, 182–185, 188–190, 197, FOR 103, FOR 104, FOR 134, FOR 135, FOR 170, FOR 171

(56) References Cited

U.S. PATENT DOCUMENTS

| | | | |
|---|---|---|---|
| 4,290,010 A | | 9/1981 | Blaess et al. |
| 5,371,760 A | | 12/1994 | Allen |
| 5,539,772 A | * | 7/1996 | Fasulo et al. ................ 375/224 |

OTHER PUBLICATIONS

Product Literature from DRA Laboratories Mailed Jan. 22, 1998, 14 Pages Print/Origination/Publication Date Unknown.

DRA Product Literature Downloaded From WWW (Internet) On Jan. 26, 1998 19 Pages Publish Date Unknown.

"Proofing and Maintaining Upstream Cable Plant with Digital Signal Analysis Techniques" by Thomas H. Williams; ARFTG Digest; Jun. 13, 1997 pp. 7–18.

Testing Cable Return Plant For Clipping–Use of a High–Speed Digital Oscilloscope–By Tom Williams, Specs Technology Publication of Cable Television Laboratories, Sep. 1996 vol. 8 No. 6.

* cited by examiner

*Primary Examiner*—Safet Metjahic
*Assistant Examiner*—Vincent Q Nguyen
(74) *Attorney, Agent, or Firm*—James R. Young

(57) ABSTRACT

A test system for measuring a frequency response of a signal path 148 by transmitting a short duration burst test signal 234 from a remote point 152, capturing an impaired burst test signal 432 on a digital signal acquisition unit 416, and analyzing the received signal by digitally processing it with an unimpaired burst test signal 434. A dynamic range test can also be performed with the same burst test signal by removing the energy in a part of the frequency band with a notch filter 232, and then increasing the power of the burst test signal level until non-linear distortion occurs. The distortion products will fill-in the notch, allowing the clipping threshold of the signal path to be measured. A burst trigger signal 244 generated by the transmitter device 201 causes a digital signal acquisition unit to acquire an impaired burst test signal.

18 Claims, 11 Drawing Sheets

TEST SYSTEM FOR MEASURING FREQUENCY RESPONSE AND DYNAMIC RANGE ON CABLE PLANT

CROSS REFERENCE TO RELATED APPLICATION(S)

This is a continuation-in-part application of copending application Ser. No. 08/865,237 filed May, 29, 1997. Now U.S. Pat. No. 5,990,687.

BACKGROUND—Field of the Invention

This invention relates to systems for testing cable networks. More particularly, it relates to systems for testing the frequency response and dynamic range of signal paths.

BACKGROUND—Description of Prior Art

Cable systems currently in use typically allow two way communications between the headend or distribution hubs and many remote points that may be houses. A headend is a collection point for both upstream and downstream signals. A distribution hub, which is sometimes used in large systems, is an intermediate point between the headend and the fiber nodes where the downstream signals from the headend are split and the upstream signals are combined. For the sake of this patent, the terms headend and distribution hub may be used interchangeably. One frequently employed architecture is hybrid fiber-coax (HFC). Forward direction, or downstream, signals are transmitted from the headend via optical fibers to fiber nodes. At the fiber node, the downstream transmission is converted from an optical signal to an electrical signal. The signal is distributed from the fiber node to a plurality of remote points, which may be homes, via coaxial cable by splitting. Amplification overcomes the losses of the cable and splitting devices. This portion of the network is referred to as a tree-and-branch system. The downstream frequency range is typically 54 to 550 MHz. Downstream signals have traditionally been analog television (TV) carriers. Digital carriers, such as digital audio, digital TV, cable telephone, and computer data, are increasingly being transported by the downstream system. The most common downsteam digital modulation technique is expected to be 64-QAM (quadrature amplitude modulation). The most common impairments expected on the downstream system are Gaussian, or random, noise and composite triple beat (CTB) distortion products.

In the return direction, or upstream, signals are transmitted from the remote points in the 5 to 42 MHz frequency band to the fiber node. The same passive devices that acted as splitters for downstream signals act as combiners for upstream signals. At the fiber optic node, the combined upstream electrical signals are converted to an optical signal for transmission to the headend. Forward and return signals typically travel inside the same coaxial cable in opposite directions. The use of diplex filters allows bidirectional travel inside a single coaxial cable. In the fiber optic bundle, forward and return signals commonly travel in opposite directions in different optic fibers. Upstream signals will typically be digital transmissions associated with services such as internet access, telephony, and polling set-top boxes for status information.

Downstream signals are typically transmitted continuously, while upstream signal transmissions, which may be originated by subscribers, are transmitted intermittently.

Cable technicians currently have sweep equipment that is used for measuring the magnitude portion of the frequency response for both upstream and downstream signal paths. The sweep equipment is typically designed to produce minimal objectionable interference with analog television signals. However, frequency response is a complex number, with both an magnitude and a phase component The problem with currently available sweep equipment is that it measures only the magnitude portion of the frequency response. Currently available sweep equipment does not measure a complex frequency response, which also includes the phase linearity of the signal path. Phase linearity is commonly expressed as group delay which is a derivative of phase with respect to frequency.

Group delay is created by filters such as diplex filters. Group delay can also be created by multipath distortion, or echoes. The multipath distortion may be created by reflections generated inside the cable plant by physical damage or water inside the cable. Multipath distortion is a serious concern in the return band because the reflections are not sufficiently attenuated by the loss of the cable, which is very low in the 5–42 MHz frequency band.

Simpler older sweep systems sweep at a very high speed so that the time that the swept signal spends in a single 6 MHz wide channel is short, thereby creating a small but noticeable interference. Some modern sweep systems use a stepped frequency approach to avoid visible interference with analog carriers. The modern sweep systems may be programmed to avoid or minimize interference with video or audio carriers. These systems do not provide any phase information about the signal; they only provide magnitude information.

There is a test system that can provide phase information about a number of cable channels. This system is called the Link Analyzer and is available from Hewlett Packard. The test system was originally designed to test microwave radio links. The system uses a swept signal that is frequency modulated as it is swept However, this system is very expensive and requires all carriers to be removed from the channel to perform the test.

One way known in the art to characterize the frequency response of a channel is to use a reference, or training, signal combined with digital signal processing techniques. The frequency response of the channel is characterized as an intermediate step in programming an adaptive equalizer. The function of the adaptive equalizer is to flatten the frequency response of the channel. The reference signal is sent by a transmitter in a quiet period while no other signals are using the frequency band, and received by a receiver. The acquired reference signal is processed with a stored reference signal that is free of impairments. This system is used by high-speed telephone modems to characterize telephone lines to increase data throughput. In the United States, this system is also used to remove the ghosts or multipath distortion from analog television signals by sending the training signal on line 19 of a vertical interval. A television receiver acquires the distorted reference signal and determines the frequency response of the channel as an intermediate step to programming an adaptive equalizer to cancel the echo, thereby improving video quality. If there are other signals using the channel when the reference signal is being sent, the energy from the other signals produces wrong equalizer settings. Thus the channel must be unoccupied while the adaptive equalizer is being programmed.

Training signals can be used at baseband or at RF (radio frequency). A baseband channel has a frequency range between DC (direct current) and some upper frequency. For example, video is a baseband signal with a frequency range such as DC-4.2 MHz. An RF channel is located between two frequencies, such as 54–60 MHz for television channel 2. If an RF channel is being tested, the training signal, which is normally a baseband signal, must be both up converted and down converted. Cable channels, such as downstream channels 2-W and upstream channels T-7 to T-12 are 6 MHz wide RF channels. The system of the present invention tests the upstream cable channels, which are group of 6 RF channels in the 5–42 MHz frequency range, as a single very wide baseband channel.

The unimpaired reference signal is typically pre-programmed at the time of manufacture into the receiver and stored in a memory, such as a read-only memory (ROM). It is not common practice to transport the receiver to the transmit site to load or capture an unimpaired burst test signal. In the cable testing application, providing a direct connection between the transmitter and receiver to capture an unimpaired burst test signal has two advantages. The first is that any imperfection in the frequency response of the transmitter or receiver will be canceled automatically. Another advantage is that any of a number of suitable burst test signals may be used.

The reference signals used ideally have the property of flat spectral energy so that any residual background noise will have a minimal effect on the frequency response data. Using flat spectral energy implies that communications in any frequency band that is in use at the time the reference signal is sent will be disturbed. It is common knowledge that the reference signal should not be sent while the channel is being used by data services because the data services will interfere with the reference signal and the reference signal will also interfere with the data services.

It has been discovered that the most common form of return band impairment is high speed bursts of noise that are typically short but powerful. The noise bursts typically last less than 10–20 microseconds but have been observed to last hundreds of microseconds. The noise bursts have most of their energy content concentrated between 5 and 15 MHz. The noise bursts are sometimes powerful enough to distort, or drive return active devices into a non-linear mode. The common sources of return noise bursts are the switching of electrical devices, such as inductive loads or motors with brushes. These noise bursts may enter the cable plant at shield breaks. Since these burst noise impairments are so prevalent, cable data modems are rapidly evolving to perform well in the presence of these impairments. There are at least three ways to adapt to burst noise in a signal path. One is to use forward error correction with interleaving to allow an error correcting code, such as a Reed Solomon code, to produce error-free data in the presence of the burst noise. Another method that is used for telephone transmissions is to use audio obfuscation. Errored voice packets are discarded and replaced with spectrally-similar information or noise to hide the audio impairment created by the missing packet. The third method is to automatically re-transmit the packets that have errors. Errored packets are detected with a cyclic redundancy check (CRC). The third method is used on the internet.

One problem facing technicians is discovering signal paths with insufficient dynamic range. Distortion is created when an active device, such as a laser transmitter or an amplifier, is over-driven into a non-linear region. When the active device is just above its maximum linear power level, the active device can be described as clipping and the signal path can be said to be above its clipping threshold. Thus it is desirable to know the clipping threshold, which is the power level at which distortion products exceed some tolerable limit. The onset of clipping is typically abrupt with laser diodes. On the downstream path, distortion products can be measured at any time since the transmissions are continuous. On the upstream path the transmissions are intermittent and unreliable, so this method is impractical. One method known in the art is to use random or Gaussian noise and a notch filter to detect distortion products. Detection is typically done by measuring a distortion power level with a spectrum analyzer. As the signal path begins to distort, distortion power begins to rise in the frequency band that was removed by the notch. Another method to detect the clipping threshold is to use sine waves which generate generating harmonics when above the clipping threshold. These methods, because of human measurement times, create interference with services.

It has been observed that some coaxial cable plant has poor field integrity due to corrosion, craft error or other problems. An earlier U.S. patent filing (Ser. No. 08/865, 237), of which this patent filing is a continuation in part, describes the problem and a solution. Basically, a burst test signal is induced onto the sheath of the coaxial cable by magnetic coupling. The sheath current enters the inside of the coax at the shield break, and is captured on the center conductor of the coax. The hardware and software described in this patent application can perform a sheath integrity test when used in conjunction with a magnetic coupling device.

It is a purpose of this invention to measurea complex frequency response of a cable system by using a burst test signal that has similar spectral and temporal characteristics to commonly observed burst noise. It is also a purpose of this invention to use the same test equipment to determine the dynamic range of the cable plant. It is also a purpose of this invention to produce minimal disturbance with upstream services, allowing testing in a frequency band that is being used by digital services. It is also a purpose of this invention to use the same hardware and software to test the integrity of home wiring by performing a sheath integrity test.

DRAWING FIGURES

SUMMARY OF THE INVENTION

This patent discloses a method of testing a signal path, which may be a cable return system that may be transporting digital signals, by using a burst trigger signal with a burst test signal. The burst trigger signal and the burst test signal are transmitted from a remote point and the burst test signal is captured at a headend by a digital signal acquisition unit which may be triggered by the burst trigger signal. The digital signal acquisition unit downloads the impaired burst test signal into a digital signal processor which may be a personal computer. The digital signal processor processes the impaired captured burst test signal with an unimpaired copy of the burst test signal to find a complex frequency response of the channel. The same burst test signal may be used to find the clipping threshold of the signal path by inserting a notch filter between a transmitter device and the signal path. Clipping of the signal path is indicated by energy in a hole created by the notch filter. By transmitting the burst trigger signal without an accompanying burst test signal, the digital signal acquisition unit can be triggered remotely, allowing the technician in the field to view the signals, or noise, present on the signal path at the headend.

The present invention uses a short burst test signal to characterize the channel. To be considered short, the duration of the burst test signal should be less than 200 $\mu$s. The burst test signal is sent in a manner that resembles burst noise, which is a common impairment on a cable return system. The burst test signal has a relatively flat spectral content The burst test signal is transmitted at a high power level for a very short time period such that the forward error correction or packet re-transmission facility of the digital services will hide the interference created by the burst test signal. This action allows a singular burst, or a number of bursts at a low repetition rate to be transmitted and avoid interference with the cable services.

There is also interference with the burst test signal by the cable services or ingressing signals. This problem is minimized by transmitting the burst test signal at a high power that is just below the clipping threshold. The high power transmission of the burst test signal typically produces a high signal to noise ratio. Also, interference effects from an interfering carrier will be constrained to the frequency band of the interfering carrier. Thus, the technician may simply ignore the inaccurate frequency response result at the frequency that he/she knows to be carrying data signals.

Figure 1:
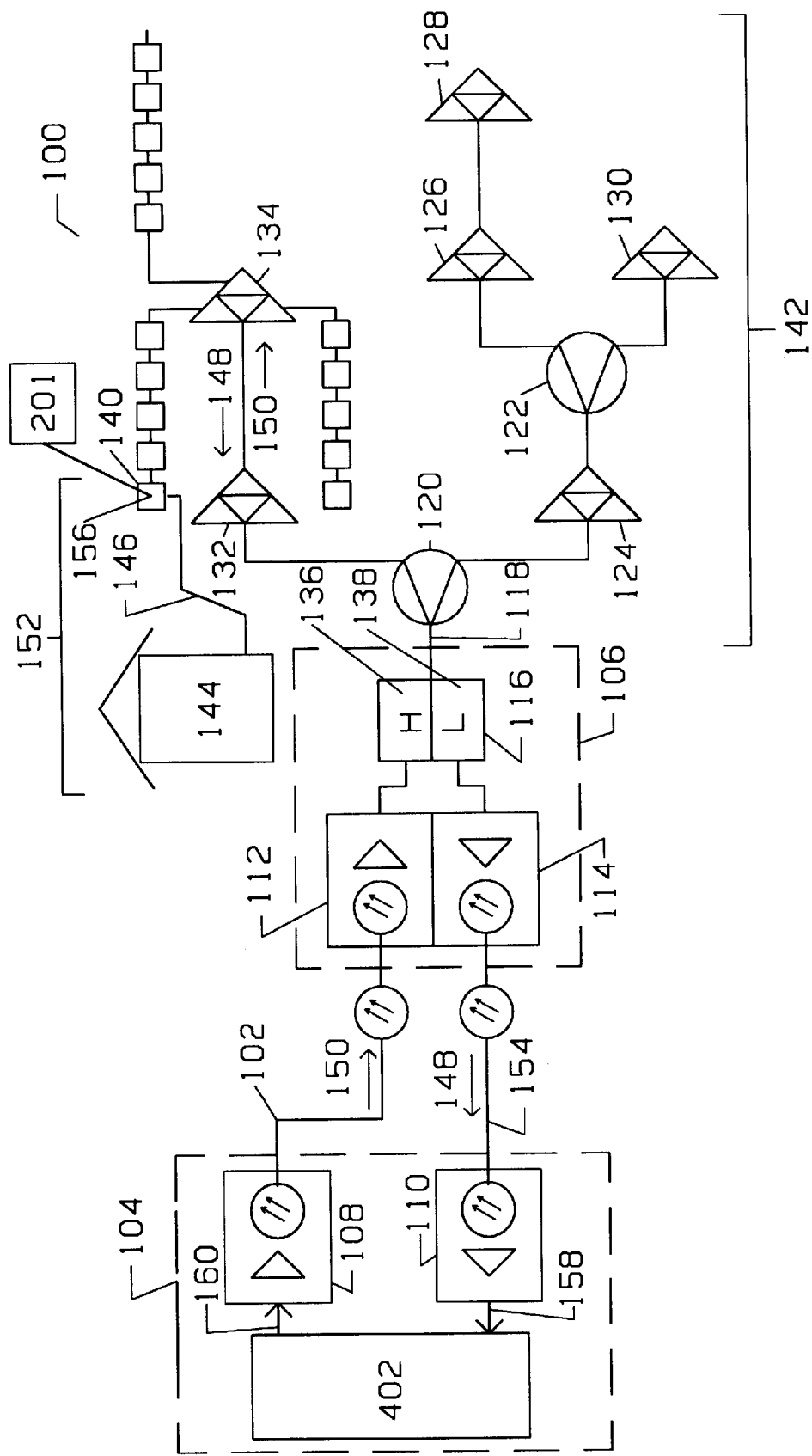
FIG. 1 is a block diagram of a simplified bi-directional hybrid fiber coax system employing the tree and branch architecture.

Discussion—FIG. 1

FIG. 1 illustrates a bi-directional cable system 100 which employ a single mode downstream fiber optic cable 102 for the long reach from a headend 104 to a fiber node 106. In the headend 104, which is the collection point for downstream signals, are located a downstream laser transmitter 108 and an upstream laser receiver 110. At the fiber node 106, which is typically housed in a weather tight outdoor housing, a downstream signal is converted from an optical signal into an electrical signal by a downstream laser receiver 112. An upstream electrical signal is converted into an optical upstream signal by an upstream laser transmitter 114. The downstream electrical signals are applied to a diplex filter 116 which allows bi-directional signal flow on a same hard line coaxial cable 118. The diplex filter consists of a high-pass section 136 and a low-pass section 138. Upstream signals taken from the hard line coaxial cable 118 pass through the diplex filter 116 into the upstream laser transmitter 114. A single mode upstream fiber optic cable 154 carries upstream optical signals to the upstream laser receiver 110 in the headend 104.

Splitter/combiners, consisting of a splitter/combiner 120 and a splitter/combiner 122 split the downstream signals and combine the upstream signals. A set of two way amplifiers 124, 126, 128, 130, 132, and 134 boost the signal level in both directions to overcome the loss of the coaxial cable 118 and the splitter/combiners 120 and 122. Taps, such as a tap 140, are also splitting/combining devices that allow signal extraction and insertion. A coaxial cable plant 142 can be defined as the coaxial portion of the bidirectional cable system 100, which extends from the fiber node 106 to the Insides of the houses such as a house 144. Typically, the coaxial cable plant 142 is constructed of solid sheath hard-line aluminum coaxial cable from the fiber node 106 to the tap 140, and a braided shield drop cable 146 is used from the tap 140 to the house 144 as well as inside the house 144. House 144 and drop cable 146 form a remote point 152.

FIG. 1 also features a remote signal insertion/extraction point 156 and a headend signal extraction point 158 and a headend signal insertion point 160. A transmitter device 201 is attached to the signal insertion/extraction point 156. At the headend 104 a receiver system 402 is connected to the signal extraction point 158.

The bi-directional cable system 100 can be observed to have a signal path 148 in the upstream direction from the remote point 152 to the headend 104, and a downstream signal path 150 in the downstream direction from the headend 104 to the remote point 152. The signal path 148 may include any portion or all of the upstream frequency ranges. Likewise, the downstream signal path 150 may include any portion or all of the downstream frequency range.

Figure 2:
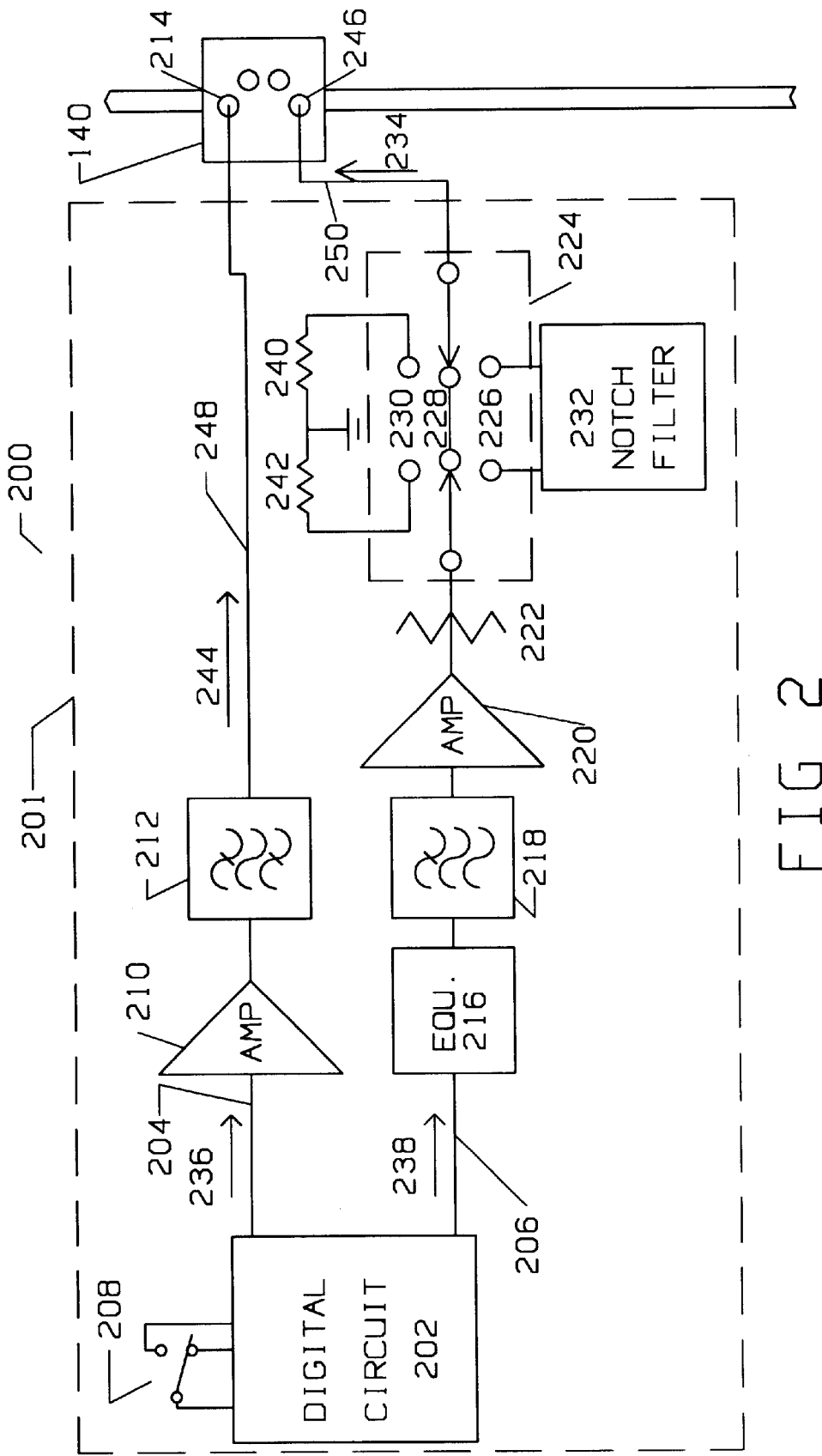
FIG. 2 is a block diagram of a transmitter device used in a test system of the present invention.

Discussion—FIG. 2

FIG. 2 is a transmitter block diagram 200 of the transmitter device 201 that is transported by a technician to the remote point 152 to generate a burst trigger signal 244 and a burst test signal 234 to test the frequency response and dynamic range of a signal path. The device can also be used to observe the background noise in a return channel by generating the burst trigger signal 244 with no accompanying burst test signal 234. The transmitter device 201 contains a digital circuit 202 that generates a digital burst trigger signal 236 on a digital burst trigger lead 204 and a digital burst test signal 238 on a digital burst test signal lead 206. The digital circuit will be explained in the discussion of FIG. 4. At the remote point 152, the technician presses a momentary contact switch 208 which causes the digital circuit 202 to generate the digital burst trigger signal 236 followed by a brief quiet period, followed by the digital burst test signal 238. The digital burst trigger signal 236 is amplified by an amplifier 210 and filtered by a bandpass filter 212. The burst trigger signal 244 on a burst trigger signal lead 248 is connected to first tap port 214 on the tap 140, where it proceeds upstream to the receiver system 402 to cause the digital signal acquisition unit to be triggered. The digital signal acquisition unit will be illustrated in FIG. 3. In the present embodiment, the burst trigger signal frequency may be 25 MHz. This frequency may need to be changed in a cable operator's system if 25 MHz is being used by digital services, because the digital services may cause the digital signal acquisition to false trigger.

The digital burst test signal 238, which may be a PN sequence, is spectrally shaped by an equalizer 216. Spectral shaping is desirable because the rectangular pulses from digital circuit 202 have a sine(x)/x shape with the first null located at the PN clock frequency which may be 50 MHz. The equalizer is comprised of an R-L-C bridged-T circuit that flattens the spectral energy. A low pass filter 218 has a corner frequency of approximately 42 MHz and is used to eliminate energy above the Nyquist frequency, thereby preventing a condition called aliasing when the received signal is sampled by the analog to digital (A-D) converter. In one embodiment, the sampling rate may be 100 Msamples/sec., giving a Nyquist frequency of 50 MHz. A broadband amplifier 220, which may be a Motorola CA2830C hybrid amplifier, boosts the signal level, while keeping the signal level within the linear range of the amplifier 220. It is necessary to have a high drive level to find the clipping threshold on the signal path. The gain of the hybrid is nominally +32 dB, and the output level should be approximately +65 dBmv. A variable step attenuator 222 reduces the burst test signal level if a high transmit level is not required. A low value tap will typically require a low signal level, while a higher tap value will typically require a higher signal level. A double-pole triple-throw switch 224 is used to select the type of test being done. In a topmost trigger-only position 230, a first terminating resistor 240 is connected to a burst test signal lead 250, which results in no test signal output. A second terminating resistor 242 terminates the broadband amplifier 220. The topmost switch position is used to trigger the digital signal acquisition unit in order to view signals or background noise being carried on the downstream signal path 150. In the middle switch position, a trigger plus burst test signal position 228, a direct connection is made between the variable step attenuator 222 and the burst test signal lead 250. This middle switch position is used to test for frequency response. In the lower switch position, a trigger plus notched burst test signal position 226, a notch filter 232 is inserted between the variable step attenuator 222 and burst test signal lead 250. This switch position is used to test the signal path 148 for dynamic range. Microwave Filter Company of East Syracuse N.Y. is a vendor for notch filters. The burst test signal lead 250 is connected to a 2nd tap port 246. Alternatively, the burst test signal 234 may be combined with the burst trigger signal 244 in a combiner, which is not illustrated, and the output of the combiner can be applied to a single port on the tap 140.

Figure 3A:
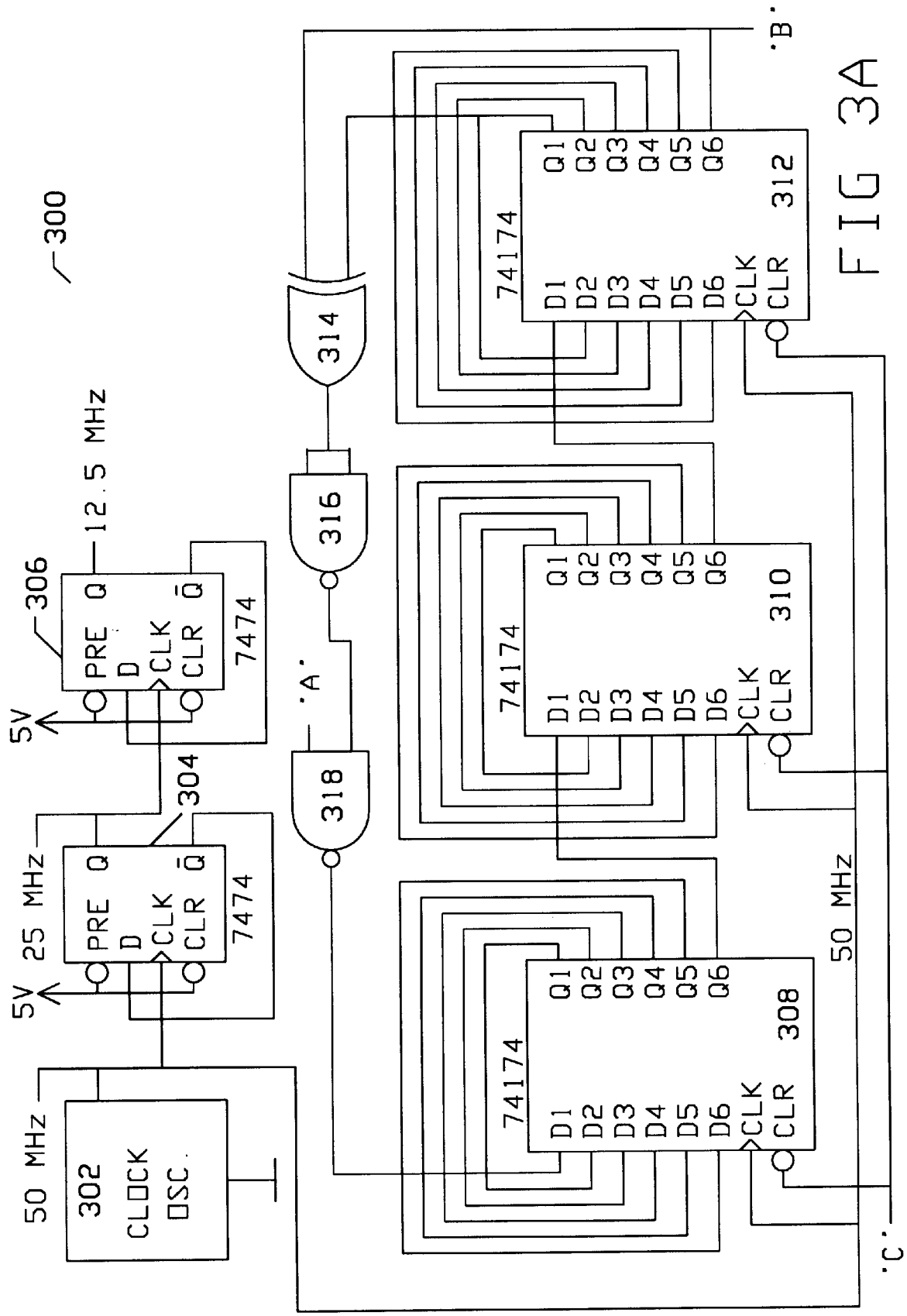
FIGS. 3A and 3B is a schematic diagram of a digital circuit used in the transmitter device.
Figure 3B:
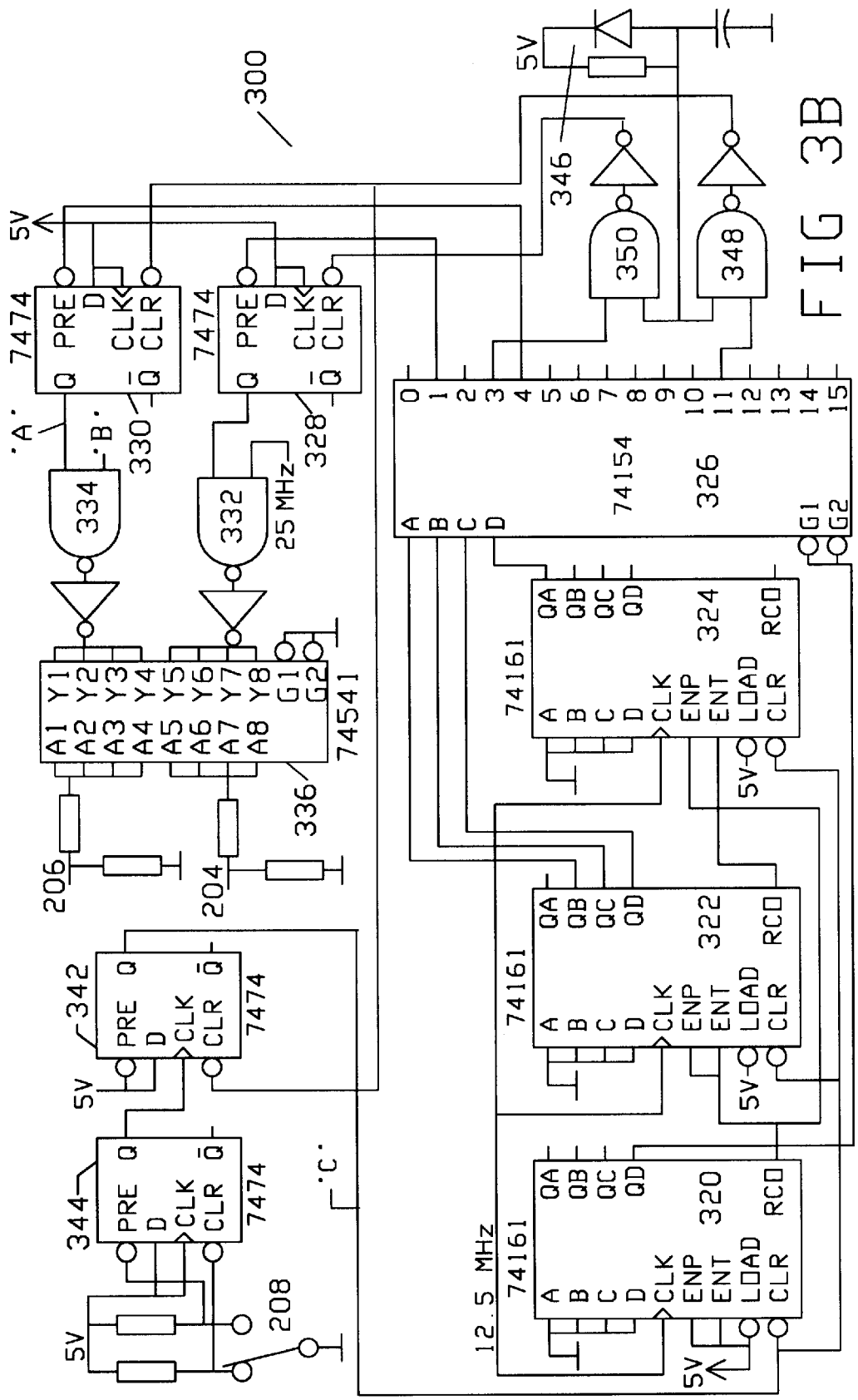

Discussion—FIGS. 3A and 3B

FIGS. 3A and 3B comprise a transmitter digital schematic diagram 300 of the digital circuit 202 that generates the digital burst test signal 238 and the digital burst trigger signal 236 for use in the burst test signal transmitter device 201. A clock oscillator 302 generates a 50 MHz square wave which is divided by 2 by a first flip-flop 304 to make a 25 MHz clock and divided by 2 again by a second flip-flop 306 to make a 12.5 MHz clock. A shift register chain is comprised of a first shift register integrated circuit (IC) 308, a second shift register IC 310, and a third shift register IC 312. The shift register chain, along with an exclusive "or" gate 314, a first "nand" gate 316, and a second "nand" gate 318 make a $2^{18}-1$ state PN generator. A counter chain comprised of a first counter IC 320, a second counter IC 322 and a third counter IC 324 make a binary counter that provides timing for the start and stop times of the burst trigger signal and the PN sequence. The incrementing counter values make a 1-of-16 decoder 326 produce outputs that first make a Q output on a third flip-flop 328 goes high for 5 microseconds, followed by a period of 2.5 microseconds with no output, followed by 18 microseconds while the Q output of a fourth flip-flop 330 go high. A third "nand" gate 332 passes the 25 MHz clock out for 5 microseconds, and a fourth "nand" gate 334 passes the PN sequence out for 18 microseconds. One half of a bus driver IC 336 drives the 25 MHz digital burst trigger lead 204 and the other half of the bus driver IC 336 drives the digital burst test signal lead 206. A fifth flip-flop 342 serves as a latch to keep the counter chain running until the transmission sequence is finished. A sixth flip-flop 344 serves as de-bouncer for a momentary contact switch 208. An optional initialize circuit 346 works in conjunction with a fifth "nand" gate 348 and a sixth "nand" gate 350 to prevent a false trigger when the device is first powered on. The integrated circuits can be built from the 74HC product line, and the circuit is inexpensive to build. In other versions of this circuit, an optional 555 timer IC is used to generate a train of bursts at a low rate, such as 15 Hz, for testing. Another optional variation continually gates the PN generator to generate a constant output. This constant output may be used for calibration with devices that require a constant input, such as a conventional spectrum analyzer or a thermal type wattmeter.

Figure 4:
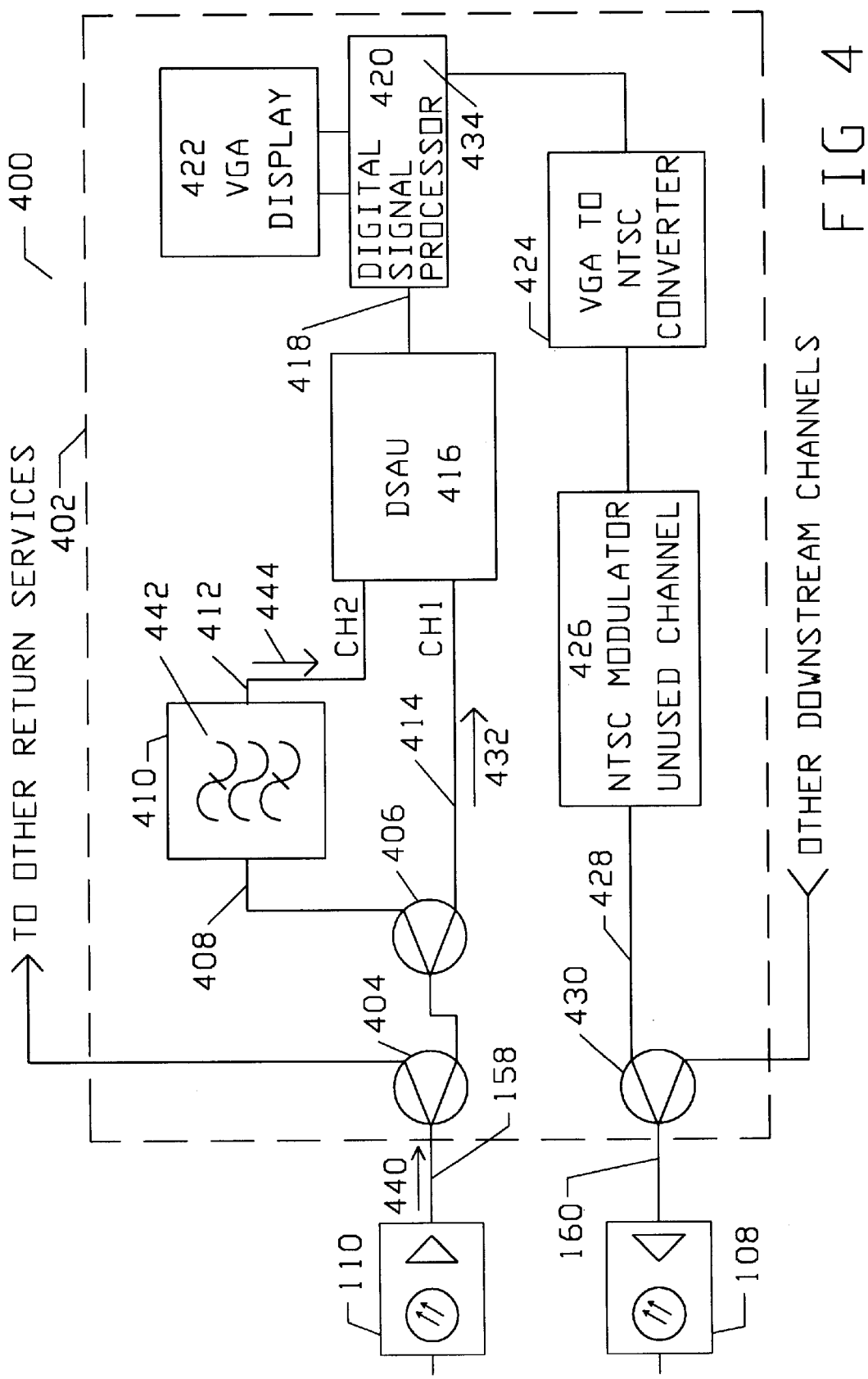
FIG. 4 is a block diagram of a receiver system of the test system.

Discussion—FIG. 4

FIG. 4 is a headend block diagram 400 of equipment connections at the headend 104 or hub site. Included in the headend block diagram 400 is a receiver system 402 for receiving and processing an impaired burst test signal 432. The upstream laser receiver 110 receives the return optic signal from the node and converts it into an electrical return signal 440 at the headend signal extraction point 158. A first headend splitter 404 splits the 5–42 MHz electrical return signal 440 and one leg of the first headend splitter 404 supplies signals for the other return services. The other leg of the first headend splitter 404 supplies signals for the balance of the receiver system 402. A second headend splitter 406 again splits the electrical return signal 440 and applies a broadband return signal line 414 to a first channel input of a digital signal acquisition unit 416 which may be a digital oscilloscope such a Tektronix TDS-220 supplied with a Tektronix TDS2CM communications module. A filter input lead 408 is applied to a headend bandpass filter 410 which may be centered at 25 MHz and have a bandwidth of 1 MHz. A trigger lead 412, which is used for triggering, connects the headend bandpass filter 410 and a second channel input of the digital signal acquisition unit 416. The headend bandpass filter 410 is a trigger circuit 442 that operates on a burst trigger signal 244 to generate a trigger burst that triggers the digital signal acquisition unit 416.

The digital signal acquisition unit 416 is under the control of a software program on a digital signal processor 420. The software program is described in the flow diagram illustrated in FIG. 5. Stored in the digital signal processor 420 is an unimpaired burst test signal 434. If a trigger burst 444 is received from the trigger lead 412, the digital signal acquisition unit 416 is triggered. The digital signal acquisition unit 416 acquires the impaired burst test signal 432 from the broadband return signal line 414, converts it into digital form, and stores it The digital signal acquisition 416 unit signals the digital signal processor 420, which may be a personal computer, that it has been triggered, and the digital signal processor 420 downloads the stored signal and processes it.

Communications between the digital signal acquisition unit 416 and the digital signal processor 420 may be accomplished over a GPIB (general purpose instrumentation bus) 418. Either RS-232 serial communications or GPIB may be used by the digital signal processor 420 to communicate with the digital signal acquisition unit. RS-232 is lower cost, but slower to download the data. After the processing is done, the results are displayed on a display 422 which may use a VGA interface. Additionally, the results may be relayed back to the field over a VGA to NTSC converter 424, which is connected to an NTSC modulator 426 such as a Scientific Atlanta 6350. VGA is a video interface standard for computer display devices and NTSC is the analog video standard used in the United States. A television signal RF output 428 from the modulator 426 is connected to a combiner network 430 which sums the television signal RF output 428 with other RF signals and applies the composite signal to a downstream laser transmitter 108 at headend signal insertion point 160. In the field, a technician views the test result on a standard television tuned to the television RF output being supplied by the modulator 426.

Figure 5:
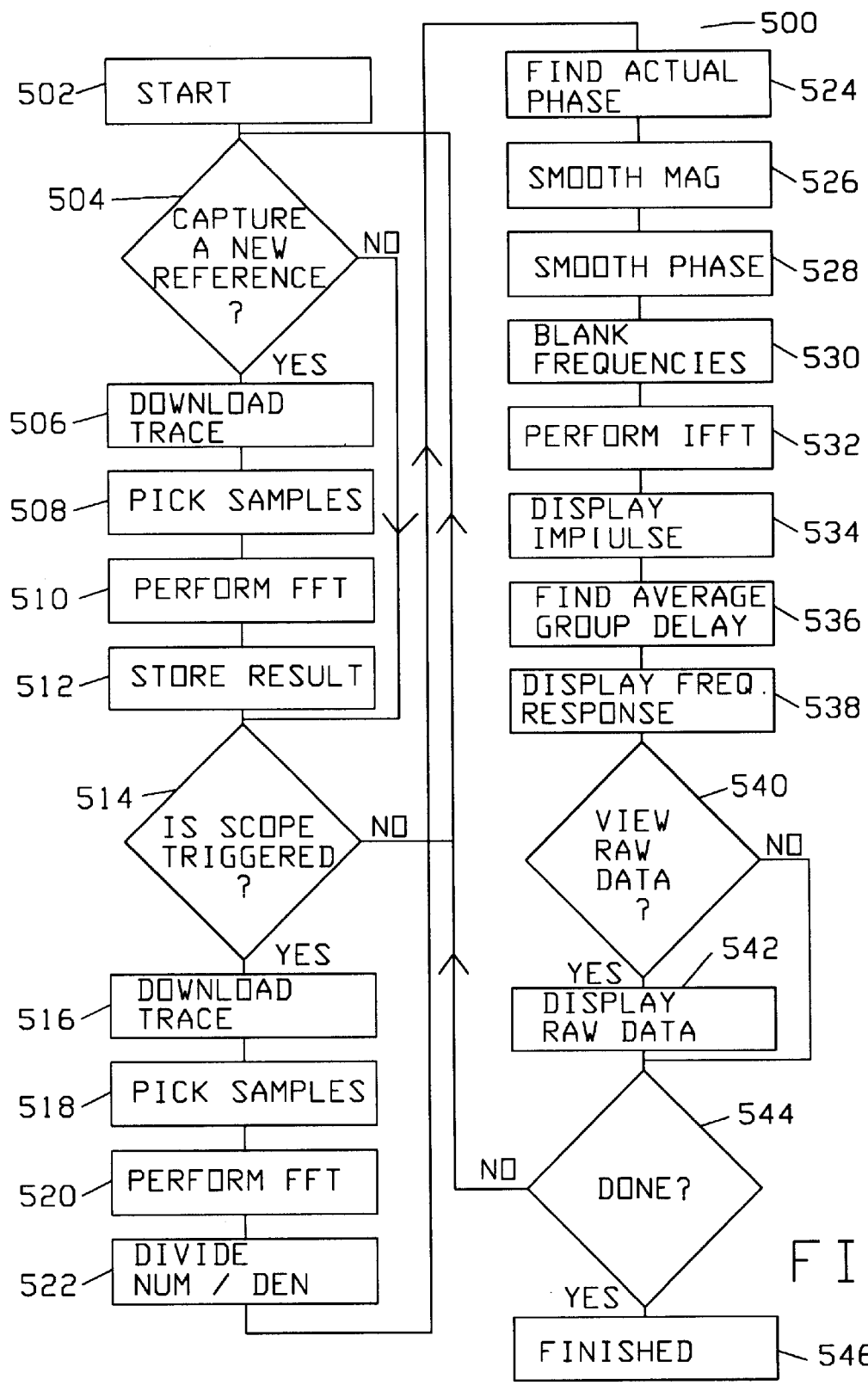
FIG. 5 is software flow diagram used by the digital signal processor to process a captured impaired reference signal to find the frequency response and impulse response.

Discussion—FIG. 5

FIG. 5 is a software flow diagram 500 that illustrates the process of finding a frequency response and impulse response from the unimpaired burst test signal 434 which is imported as a time trace and an impaired burst test signal 432 which is also imported as a time trace. The software may run on a digital signal processing integrated circuit, such as the Texas Instruments TMS320C30, on a personal computer, or on a workstation. The process starts at a 1st step 502. At a 2nd step 504 the technician may choose to capture a new copy of the unimpaired burst test signal 434. If the stored copy of the unimpaired burst test signal 434 is used, the process continues at a 7th step 514. If a new copy of the unimpared burst test signal 434 is chosen, a technician connects the transmitter device 201 to the digital signal acquisition unit 416 and transmits an unimpaired burst test signal 234 directly into the digital signal acquisition unit 416. This is typically done when the transmitter and receiver are both in the same physical location. The new trace is downloaded from the digital signal acquisition unit in a 3rd step 506.

The fast Fourier transform (FFT) is a discrete linear transform that can be used to transform a block of time domain data points into a block of frequency domain data points. The inverse fast Fourier transform (IFFT) performs an inverse transformation with a block of frequency domain data points to a block of time domain data points. The FFT uses complex numbers and is well known in the art. The manner in which the FFT operates on blocks of discrete data is also well known in the art. The data points comprising the data blocks in both the time and frequency domain have coefficients. The data points may be described as terms with coefficients which are the values of the terms. The FFT is a discrete transform, and the size of the data block is typically two raised to some integer power, such as 2048 or 4096.

In a 4th step 508, the samples that will be used in a first FFT are chosen from the total number of samples captured. The number of data points downloaded may be 2500, but the number of data points used by the FFT is nominally 2048. The FFT is used to convert the time trace into the frequency domain. The software source code to do a FFT may be found in "C Language Algorithms for Digital Signal Processing" by Embree and Kimble, ISBN #0-13-1334406-9. The entire 18 $\mu$s PN transmission is captured between the first and last data points of a data block that is to be transformed. The accuracy of the resulting frequency domain data is reduced if a portion of the PN sequence in the unimpaired burst test signal 434 falls outside of the 2048 point transform block. The unimpaired burst test signal 434 is transformed using the FFT in a 5th step 510 to create an unimpaired frequency domain data block. The transform yields 2048 complex data points of frequency domain data which are stored in a semiconductor memory and/or disk memory in a 6th step 512.

In the 7th step 514 the digital signal acquisition unit 416 is interrogated by the digital signal processor to determine if it has been triggered by the trigger burst 444. If it has not, the trigger status is rechecked in about 1 second. If the digital signal acquisition 416 unit has been triggered, the captured impaired burst test signal 432 is downloaded in an 8th step 516. In a 9th step 518 the impaired samples to be used in a second FFT are chosen, and in a 10th step 520 the second FFT is performed on the impaired burst test signal 432 to create an impaired frequency domain data block. In an 11th step 522 the impaired frequency domain data block is divided by the unimpaired frequency domain data block on a frequency-by-frequency basis. That is, each coefficient in the impaired frequency domain data block is used in a numerator, and each corresponding coefficient in the unimpaired frequency domain data block is used as a denominator. This yields a frequency response data block comprised of 2048 complex data points which are quotients. However, since zero was used for the coefficient value on all of the imaginary time-domain coefficients, only 1024 of the data points contain unique frequency domain information.

As an example of complex division, if a numerator (impaired) coefficient of the 100th term is 1.2 at an angle of +30 degrees, and the denominator (unimpaired) coefficient of the 100th term is 0.6 an angle of +10 degrees, the frequency response at the 100th frequency sample is 2.0 (1.2/0.6) at an angle of +20 degrees (+30−10).

In a 12th step 524 the frequency domain data block is counted for rotations. This is done to calculate the actual phase angle, which may be thousands of degrees, from the raw data which presents angles only between −180 and +180 degrees. Raw data is data that has not been fully processed for the frequency response. This is done by subtracting the phase angles at 2 adjacent frequencies. If the phase difference is >+180 degrees it is assumed that a positive rotation has occurred. If the phase difference is <−180 degrees, it is assumed that a negative rotation occurred.

At a 13th step 526 the data is smoothed to be more useful. The smoothing is accomplished by using the coefficients of data points that are at neighboring frequencies. Neighboring frequencies have small numerical frequency differences from each other. Smoothing may be necessary because the signal to noise ratio of the impaired burst test signal 432 is insufficient, or because of quantizing noise in the A-D (analog to digital) converter in the digital signal acquisition unit 416. Likewise, PN sequences do not have uniform energy at all frequencies and some frequencies have very low energy. If a frequency coefficient with low energy is used in the denominator of a complex division, it will cause a resultant increase in any noise component in the numerator frequency coefficient A novel magnitude smoothing algorithm is used to average 8 or 16 additional data points and avoid the problem of a frequency sample with low energy. The smoothed 8 point magnitude average is calculated as:

$$smag[n] = \frac{\sum_{n-4}^{n+4} num[n]den[n]}{\sum_{n-4}^{n+4} den[n]} \quad [1]$$

where num[n] is the impaired numerator magnitude at a frequency sample, n , den[n] is the unimpaired denominator at that frequency, and smag[n] is the smoothed magnitude result. Four data points before and 4 data points after the current sample are used in the smoothing. Thus, noise at any frequency with low energy has very little bad effect on the overall smoothed result since it contributes very little to the numerator.

It is also very useful to have smoothing on the group delay result, as illustrated in a 14th step 528. The group delay is the slope of the phase, and the slope may be smoothed by using a "dumbbell method". In this method, smoothing is done over a positive and negative 4 point range. An average is made of the positive 2 data points and the negative 2 data points that are furthest away from the center point The slope of the line between the averages, comprised of the negative fourth and negative third data points, and the positive fourth and positive third data points is calculated as:

$$sgd[n] = 0.1448\left(\frac{ph[n-4]+ph[n-3]}{2} - \frac{ph[n+4]+ph[n+3]}{2}\right) \quad [2]$$

where sgd[n] is the smoothed group delay, ph[n] is the phase angle which has been corrected for the number of rotations, and 0.1448 (1/7) is used to correct the phase angle. There are seven samples between the centers of the two averages. This method is called the "dumbbell method" because the weighting is done using the terms near the ends. A "bow-tie" method could also be used where the weighting applied to terms increased as the absolute distance of the term from the center term increased.

If smoothing is not done to reduce noise, averaging of more traces may alternately be used to improve the result. This is the traditional approach in echo cancellation, since smoothing the frequency response may cause the tap coefficients to be wrong. However, more transmissions of burst test signals for averaging cause more interference with data services. Thus smoothing is important to create low noise data without using multiple burst transmissions for averaging. Excessive smoothing causes a loss of detail, so the technician may increase or decrease smoothing as desired or as necessary.

An inverse FFT (IFFI) may be used to convert un-smoothed frequency domain data into the time domain in order to create an impulse response. In preparation for doing the IFFT, at an optional 15th step 530, coefficients are zeroed at frequencies that do not have useful data. For example, in a 5–42 MHz return system, the coefficients of frequencies below 5 and above 42 may be forced to 0 to improve the result In a 16th step 532 the IFFT is taken on the un-smoothed data. The resulting real coefficients will contain the impulse response, and the resulting imaginary coefficients will all be zero. At a 17th step 534 the impulse response is displayed.

At an 18th step 536 the average group delay is calculated for a frequency range, such as 10 to 25 MHz, so that the group delay plot will be presented in the center of the screen. The average is applied to the group delay data as an offset. In a 19th step 538, the offset group delay, phase, and magnitude are displayed.

At a 20th step 540 the technician may also decide to review the raw burst test signal data or the raw impaired burst test signal data. If the technician chooses to view the raw data at a 21st step 542, this data is presented on a separate raw data screen with both time and frequency traces available for inspection.

If a clipping test is being performed, a notched burst power above the clipping threshold will be evident when viewing a notched spectral plot on the raw data screen. The total power of the impaired burst test signal, or an impaired notched burst test signal, may be displayed as a numerical value on the raw data screen. Depending on the total power reading, the technician may decide to adjust the transmit power up or down. This spectral trace is one half of the raw data presented in a 21st step 542; the other half of the raw data is the time trace from the digital signal acquisition unit 416.

The technician may additionally choose to view un-smoothed frequency domain data, or 16 point smoothed data for less or more smoothing effect, as desired. At a 22nd step 544 the technician is given the choice of terminating the testing at a 23rd step 546 or restarting at the 2nd step 504.

Figure 6:
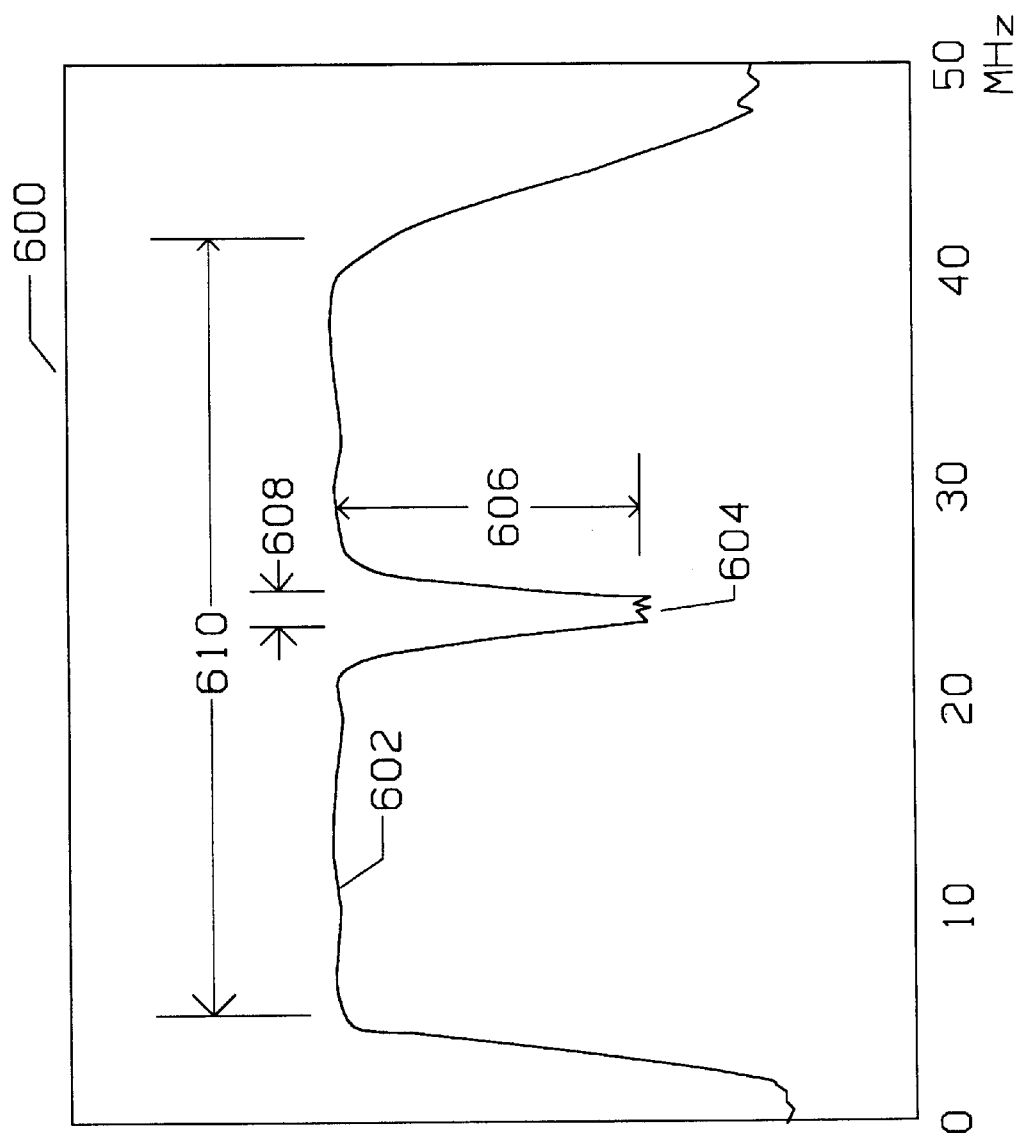
FIG. 6 is the spectral response of a notched burst test signal.

Discussion—FIG. 6

FIG. 6 is a notched spectral plot 600 of the captured impaired notched burst test signal that has a portion of its frequency band removed by the notch filter 232. A plot 602 is obtained by first capturing the notched impaired burst test signal. Second, a 2048 point FFT is performed on the captured notched impaired burst test signal. Third, an averaging of the spectral waveform is done by performing a simple moving average using 8 frequency coefficients to make a single averaged point Fourth, the logarithm is taken on the magnitude of the frequency. The averaged magnitude, when plotted, shows a hole 604 created by the notch filter. If a depth of the notch 606 is above some minimum threshold, the signal path is below the clipping threshold. If the depth of the notch 606 is not above some minimum threshold, the notched impaired burst test signal is at or above the clipping threshold. By adjusting the power of the transmitted notched burst test signal while observing the depth of the notch 606, the clipping threshold for the signal path can be determined with only a very brief disturbance to the signal path.

It is easy to determine the energy in a frequency range by summing the power contained in each discrete frequency sample comprising the frequency range. Hence it is possible to measure the power in a notch frequency band 608 compared to the power in a total frequency band 610, and display this power ratio in decibels to indicate the level clipping, which may be above the clipping threshold.

This test method for clipping is fundamentally different from the method of using notched random or Gaussian noise because the probability distribution function for random noise, which is bell-shaped, is dramatically different from the probability distribution function for PN. Hence, the onset of clipping will be more abrupt with PN. Another large difference is that PN is deterministic but random noise is not. That is, the notched burst test signal will be the same each time the test is run, which produces consistent results for a short duration clipping test.

A burst of notched random noise could also be used to determine the clipping point of a signal path, but it would not be as repeatable as PN for a brief burst. Alternately, the burst of notched random noise could be captured, digitized, and stored in random access memory. When the random noise was played from memory into a high speed digital to analog (D-A) converter, it would have a similar probability distribution function as random noise, but be repeatable every time it was played. This is another novel way to solve the problem, but not as inexpensive as a PN generator. Also, the stored random noise would no longer be truly random.

When capturing time traces with an 8-bit A-D converter, the effective number of bits will most likely establish the bottom of the notch more readily than the notch filter's performance. Typically the effective number of bits for an 8 bit A-D converter is 6–7, giving a maximum notch depth of about 36 dB. Using more bits in the A-D converter or using an 8 bit A-D converter with higher accuracy will allow the detection of the clipping point to occur at a lower power level.

Figure 7:
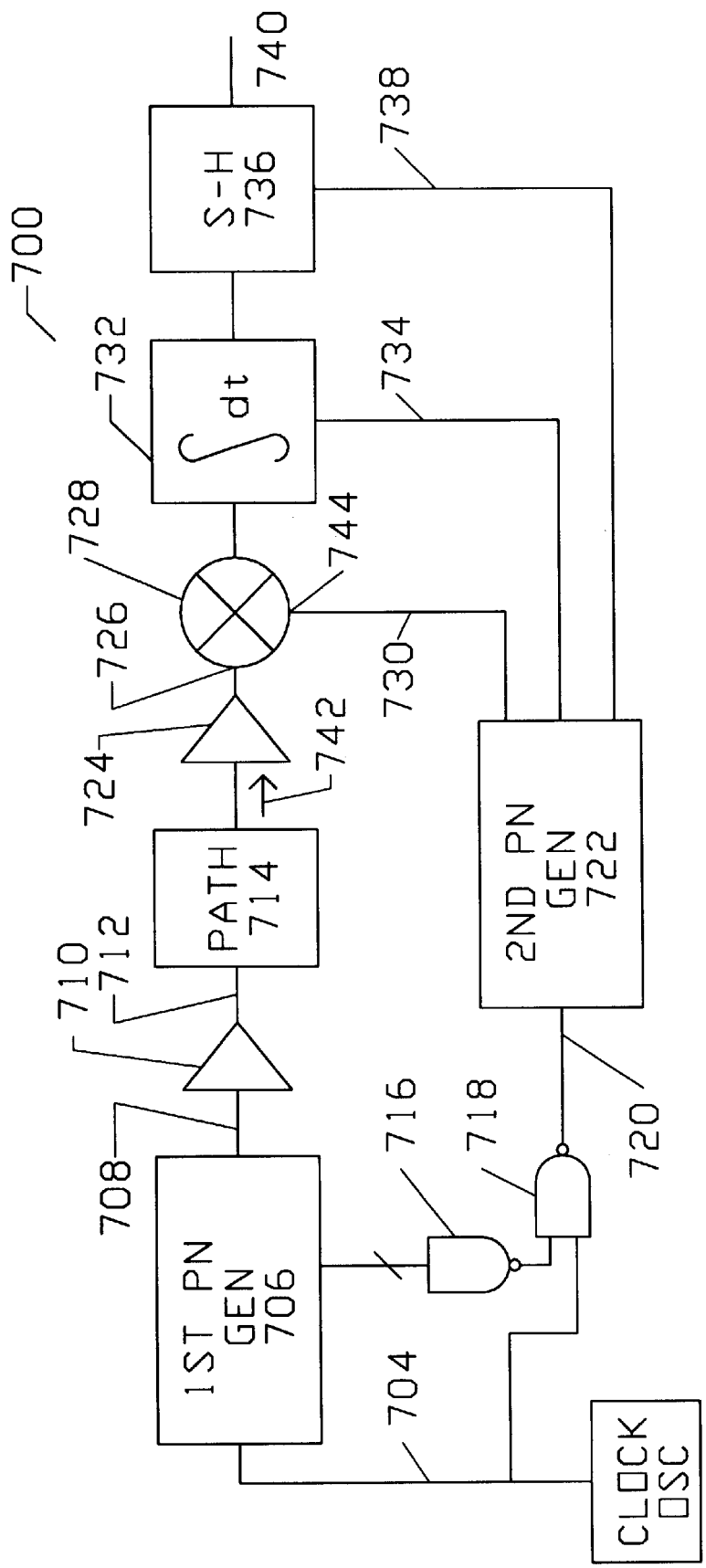
FIG. 7 is a hardware block diagram of a time domain processing unit that finds the impulse response of an impaired test signal.

Discussion—FIG. 7

It is known by those skilled in the art that a multiplication in the frequency domain is mathematically equivalent to a convolution in the time domain. This fact is explained in "An Introduction to Digital Signal Processing" by John Karl, ISBN #0-12-398420-3 (pp. 88–89). The digital signal processing performed in flow diagram 400 is essentially a multiplication of the impaired frequency domain coefficients by the reciprocal of the unimpaired frequency domain coefficients. It is possible to also find the impulse response using time domain signal processing. The impulse response of a signal path can alternately be found by:

1. transmitting a signal such as the burst test signal 234.
2. receiving the impaired burst test signal 432.
3. obtaining a copy of the unimpaired burst test signal 434
4. performing a circular convolution of the impaired burst test signal 432 with the unimpaired burst test signal 434.

The circular convolution yields an impulse response. A convolution between two series of numbers is done by multiplying each of the coefficients in one series of numbers by the corresponding coefficient In the second series of numbers. The products are then summed together. Next the second series is shifted in a circular direction by one position. The multiplication process, followed by addition of products, is repeated. After the numbers have been shifted in a full circle, the impulse response is found.

Mathematically this process is represented by:

$$x_3[n] = \sum_{m=0}^{N-1} x_2[m]x_1[n-m] \quad [3]$$

where $x_1$ is the unimpaired signal, $x_2$ is the impaired signal, $x_3$ is the circular convolution of the impaired signal with the unimpaired signal. n, and m are index variables. N is the number of terms around the circle. After the impulse response is found, the frequency response can be found by performing an FFT on the impulse response data.

Circular convolution digital signal processing can be done using the same hardware illustrated in FIGS. 2–4. This includes the same triggering mechanism, the same digital signal acquisition unit, and the same reference signal transmitter unit transmitting the same reference signal. Note that for the sake of performing a convolution, it is important to capture the entire burst test signal including a quiet period on both ends of the active 18 μs PN sequence.

A linear convolution, as explained n Karl's book, between the unimpaired burst test signal and the impaired burst test signal can also be done.

Figure 8:
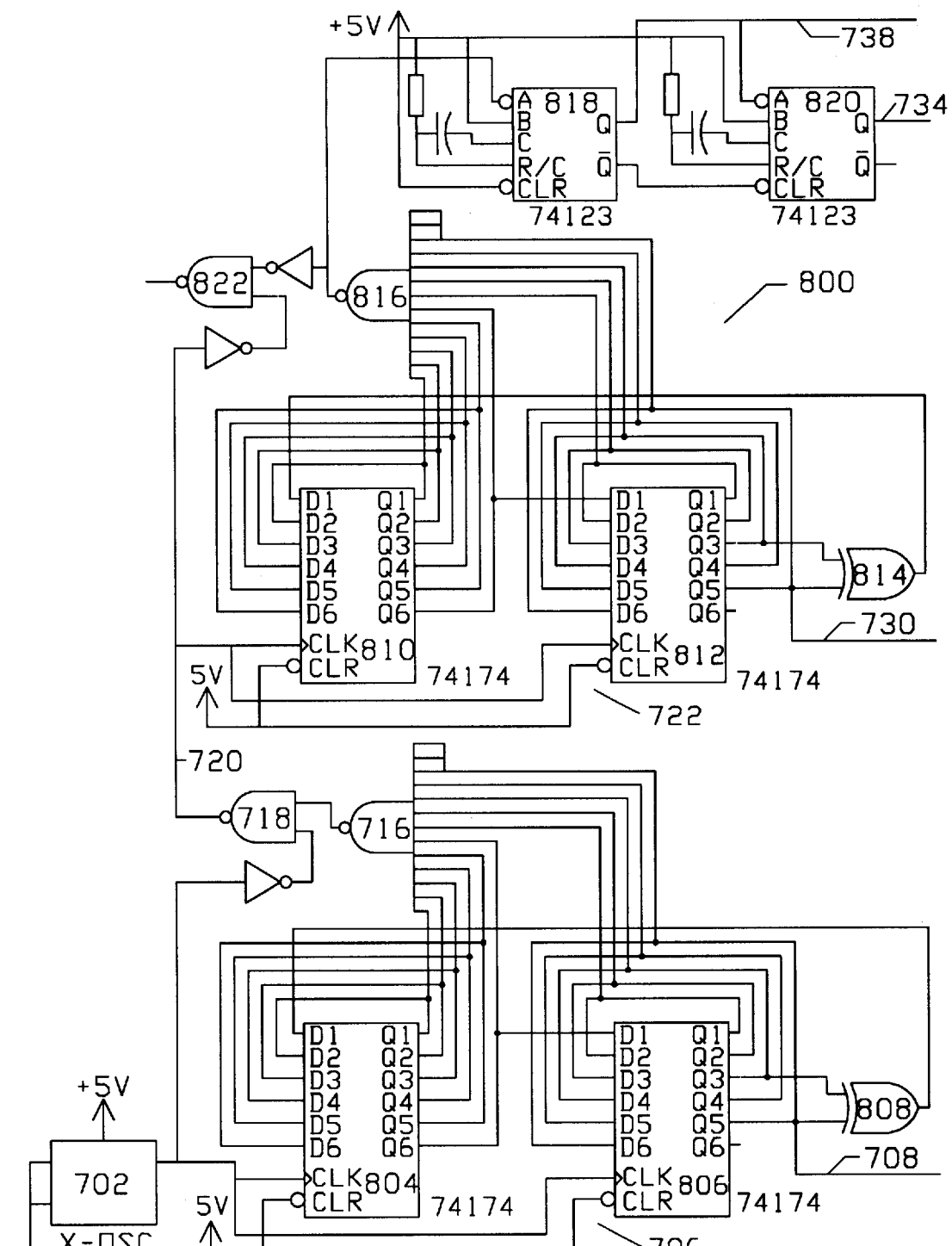
FIG. 8 is schematic diagram of the digital portion of a pseudo-noise (PN) correlator circuit that finds the impulse response of an impaired signal.
Figure 9:
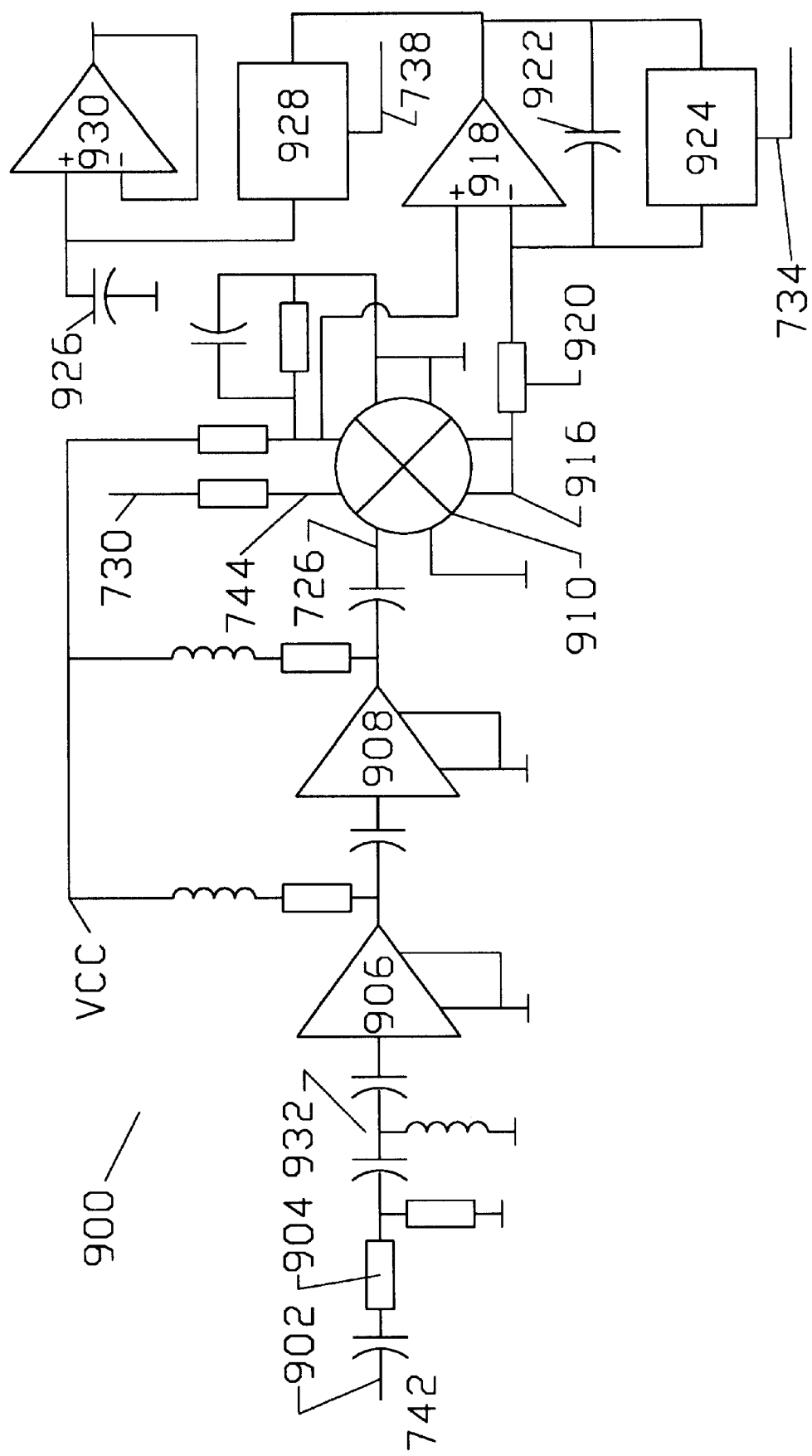
FIG. 9 is schematic diagram of the receiver portion of a PN correlator circuit that finds the impulse response of an impaired signal.

A circular convolution can alternately be done in hardware at very low cost with the novel circuits of FIGS. 7–9. This approach allows an impulse response to be found without a digital time trace acquisition unit 416, a digital signal processor 420, or software as illustrated in FIG. 5. This circuit does not use a single burst test signal; the test signal cycles continuously with back-to-back burst test signals. Because the burst test signal cycles continuously, it does not require a burst trigger. A resultant impulse response also continuously cycles at a slow rate.

The circular convolution in hardware is done by:

1. generating with a first PN generator 706 a first PN output 708.
2. generating a delayed but otherwise identical second PN output 730 with a second PN generator 722.
3. transmitting the first PN output 708 into the signal path 714.
4. receiving and amplifying an impaired PN signal 742.
5. multiplying the impaired PN signal 742 by the 2nd PN output 730.
6. integrating the result of the multiplication with an integrator 732.
7. sampling the integrator 732 followed by a zeroing of the integrator.
8. shifting the relative time difference between the first and second PN outputs and repeating steps 3–7.
9. Repeating the process as long as required until the all data points on the circular convolution are found.
10. Optionally perform an FFT to get a frequency response from the impulse response.

FIG. 7 is a hardware block diagram 700 of a hardware-only system to find an impulse response. The approach is used as a very low cost method of finding the impulse response. The low cost is achieved by not using an expensive digital signal acquisition 416 unit with a high-speed A-D converter, or a digital signal processor 420 for processing. However, the low cost is achieved at the expense of speed. This approach has application for performing a house sheath integrity test as described in the parent patent application. This approach can also be used to test a return signal path which is not transporting other signals. A clock oscillator 702 delivers a 1st pulse train 704 to a 1st PN generator 706 at a frequency that may be 50 MHz. The 1st PN generator 706 generates a PN sequence that periodically repeats its PN sequence every 2048 counts, which takes 40.96 μs. A 1st PN output 708 is amplified by a driver amplifier 710, and optionally low-pass filtered in a conventional fashion. A driver amplifier output 712 is applied to the input of a signal path 714 whose impulse response is to be measured. An impaired PN signal 742 comes out of the signal path 714. When the 1st PN generator 706 reaches an all 1's state, "nand" gate 716 goes low for 20 ns. When the "nand" gate's output goes low, a 2 input "nand" gate 718 removes one pulse from a 2nd pulse train 720 feeding a second PN generator 722. Except for the clock signal, 2nd PN generator 722 is identical to the 1st PN generator 702. Thus 1st PN generator 706 receives a 1st pulse train at 50 Mpulses/sec as a clock The 2nd PN generator 722 receives the 2nd pulse train 720 at 49.975 Mpulses/sec. This causes the 2nd PN generator 722 to "slip" synchronization with the 1st PN generator 706 by one pulse every 40.96 μs. Thus the 2nd PN generator runs at 2047/2048 of the rate of the 1st PN generator. After 2048 slipped pulses, which requires 83.88 milliseconds, the 1st PN generator 706 and the 2nd PN generator 722 are again briefly in synchronization.

The impaired PN signal 742 from the signal path 714 is amplified by an amplifier 724 and applied to a 1st input lead 726 of a multiplier 728. A 2nd PN output 730 of the 2nd PN generator 722 is used to supply a 2nd input lead 744 to the multiplier 728. The output of the multiplier is connected to an integrator 732. The output of the integrator 732 is connected to a sample-and-hold circuit 736. A sample-and-hold output 740 repeats the desired impulse response every 83.33 milliseconds and may be viewed on low-cost, low-speed analog oscilloscope, or digitized by a slow A-D converter which may be purchased in low-cost microprocessors such as the Motorola MC6805. The impulse response appears as a bar graph with another bar, representing another time value, every 40.96 μs.

When the 2nd PN generator 722 reaches an all 1's state, a sample-and-hold line 738 pulses high briefly and causes the output voltage of the integrator 732 to be sampled and held. A integrator discharge line 734 briefly pulses high immediately after sample-and-hold line 738 goes low. This integrator discharge line 734 resets the integrator 732 to zero. The integrator 732 may generate both positive and negative voltages, depending on the impulse response of the signal path.

Discussion—FIG. 8

FIG. 8 contains a digital schematic diagram 800 of a PN transmitter. The digital schematic diagram 800 along with a receiver schematic diagram 900 in FIG. 9 embody the principle of operation illustrated in FIG. 7. The clock oscillator 702 runs at a frequency such as 50 MHz. A shift register IC 804 and a shift register IC 806 along with an "exclusive or" gate 808 form the 1st PN generator 706 that repeats its sequence every 2048 clock cycles, or every 40.96 $\mu$s. The 1st PN generator 706 generates the first PN output 708. The "nand" gate 716 decodes the terminal all 1's state of the 1st PN generator 706 and puts out a negative pulse every 40.96 $\mu$s. The negative pulse removes one pulse from the 2nd pulse train 720 at the output of the 2 input "nand" gate 718. The output of the 2 input "nand" gate 718 forms a clock for the 2nd PN generator 722 comprised of a shift register IC 810 and a shift register IC 812 and an "exclusive or" gate 814 that generates the identical but delayed 2nd PN sequence on the 2nd PN output 730. Every time a terminal count is reached on the 1st PN generator 706, the 2nd PN generator 722 is delayed by one additional clock cycle. The net effect is that after 2048 negative pulses from the 2 input "nand" gate 718, the 1st PN generator 706 and the 2nd PN generator 722 are in synchronization. This requires 83.88 milliseconds. A 1st one-shot 818 provides a 1 $\mu$s pulse to the sample-and-hold line 738 to cause the sample-and-hold circuit 736 to sample the analog voltage at the output of the integrator 732. When the 1st one-shot 818 times out and goes back low, it causes a 2nd one-shot 820 to output a pulse of duration of 1 ps to integrator discharge line 734. This second pulse causes the integrator 732 to reset by shorting a capacitor as will be described in the discussion of FIG. 9.

A "nand" gate 816 detects when the second PN generator 722 reaches an all 1's state. When both 1st PN generator 706 and 2nd PN generator 722 simultaneously reach all 1's state, 2 input "and" gate 822 generates a high pulse, which is used for synchronization of a display device, such as a low cost oscilloscope.

Discussion—FIG. 9

A receiver schematic diagram 900 is a circuit that operates in conjunction with the circuit of FIG. 8 to implement the block diagram illustrated in FIG. 7. The impaired PN signal 742 from the signal path 714 is connected to an input 902 which is AC coupled with a bypass capacitor to a minimum loss pad 904. The minimum loss pad improves the input return loss as well as matching the 75 ohm cable input to a 50 ohm input impedance required by an amplifier stage 906 and an amplifier stage 908 which may be MSA-0304 monolithic amplifiers from Hewlett Packard with about 12 dB of gain each. A high pass filter 932 may be employed to improve the accuracy of the impulse response if there is additive radio interference in the path 714. Additive interference may come from AM radio stations in the test area. Amplifier stages 906 and 908 with surrounding components form amplifier 724.

A double balanced mixer 910 which may be obtained from Mini-Circuits as their part number SBL-1 is the multiplier 728. The double balanced mixer 910 contains the 1st input lead 726, which is an RF (radio frequency) input, the 2nd input lead 744 which is a LO (local oscillator) input and an IF (intermediate frequency) output 916. The 1st input lead is driven by the amplifier stage 908 which contains the amplified impaired PN signal 742. The 2nd input lead 744 is driven by the 2nd PN output 730. The IF output 916 is applied to the integrator 732 which is comprised of an integrator resistor 920, an integrator capacitor 922, and an operational amplifier 918, which may be a Texas Instruments TL074. A charge dump switch 924, which may be a CD4066 IC field effect transistor switch, is connected across the integrator capacitor 922. The charge dump switch 924 is controlled by the integrator discharge line 734 which is connected to the 2nd one-shot 820. The sample-and-hold circuit 736 is formed by a sample-and-hold capacitor 926, a sample-and-hold switch 928, and an operation amplifier 930, which is wired as a voltage follower. The sample-and-hold switch 928 is controlled by the sample-and-hold line 738.

When the terminal count is reached on 2nd PN generator 722 a pulse is generated by the 2nd one-shot 820 which causes the voltage at the output of the integrator 732 to be transferred onto the sample-and-hold capacitor 926. Subsequently, the integrator discharge line 734 goes high briefly discharging the integrator capacitor 922 which causes the integrator 732 to reset.

The embodiment of FIG. 7 illustrates a very low cost circuit which combines portions of the transmitter and receiver into the same circuit If the transmitter and receiver portion are physically separated, another 2nd PN generator 722 must be supplied for the receiver portion. This means that a 2nd pulse train 720 must be generated at the receive site without the aid of the 1st pulse train 704 which would be located at the transmit site. This can be done with a replication of the entire circuit of FIG. 8, but 2 precision clock oscillators must be used to minimize a frequency difference between the two clock oscillators. Alternatively, the two clock oscillators can be phase-locked to a common carrier on the downstream system, such as the video carrier used for broadcast television channel 2.

For some applications, such as sheath integrity testing, it is not necessary to find the complete impulse response, only a portion of it. The complete impulse response is necessary if the FFT is to be performed. If only the first microsecond of the impulse response is desired, the time required to do the test can be shortened dramatically. This can be done by forcing both 1st PN generator 706 and 2nd PN generator 722 of FIG. 8 to reset to the all 1's state 1 $\mu$s after the output of "and" gate 822 goes high.

Figure 10:
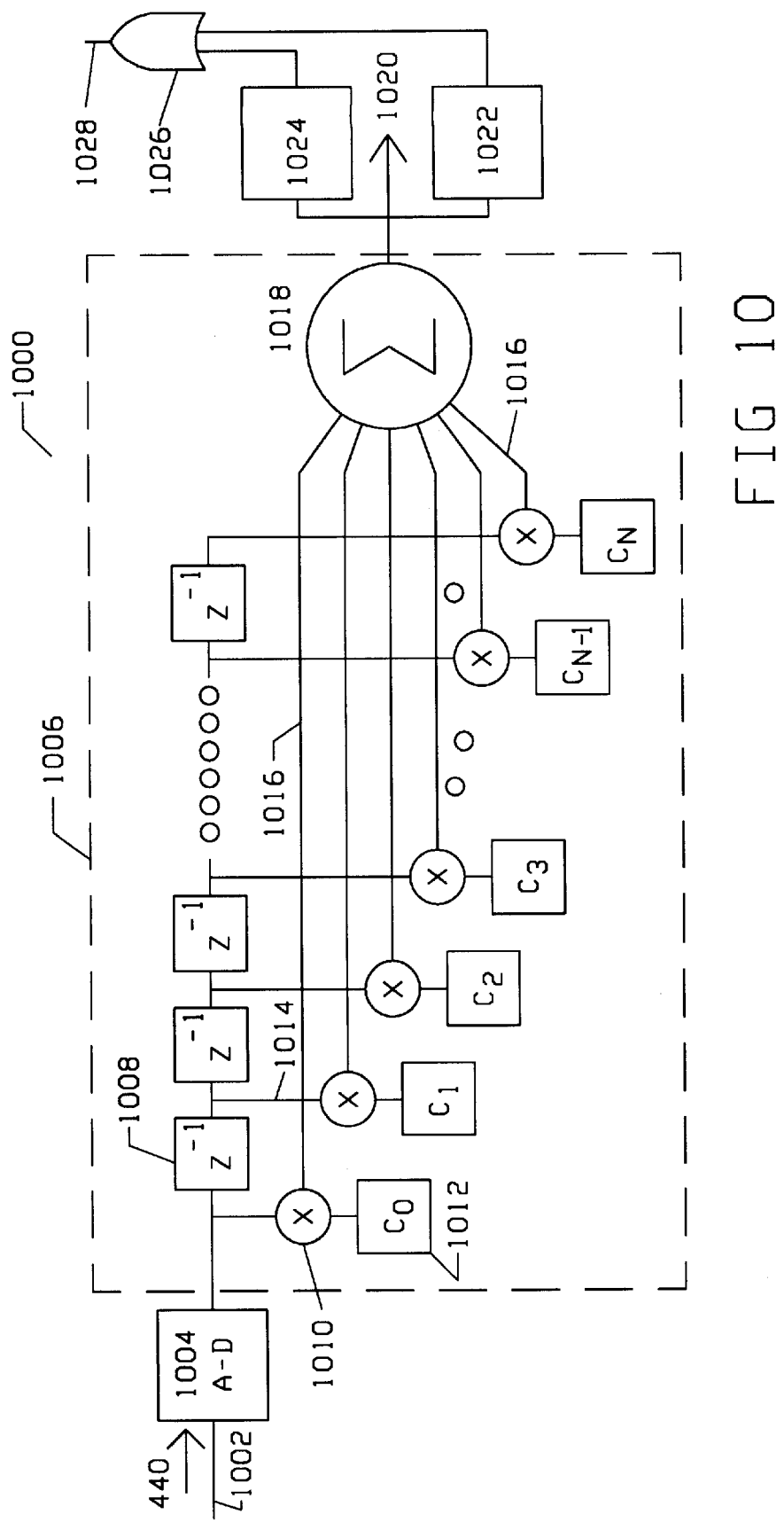
FIG. 10 is a block diagram of a circuit that can generate a trigger from an impaired burst test signal.

Discussion—FIG. 10

A test system of the present invention can be built to operate without the separate burst trigger signal 244. In essence, the burst test signal 234 also becomes a burst trigger signal. Likewise, the burst test signal 234 functions or acts like the burst trigger signal. This can be accomplished by triggering on the burst test signal 234 itself by constructing a burst test signal detector that will even detect the impaired burst test signal 432. This is accomplished at the headend 104 by use of a digital finite impulse response (FIR) filter. FIR filters are known in the art and can be purchased in the form of IC's. The full electrical return signal 440 is converted into digital form with an A-D converter and passed into a FIR filter. The FIR filter's coefficients are pre-programmed with all or part of the PN sequence that is being transmitted in the burst test signal 234. If the output of the FIR filter produces a strong positive or negative impulse at the output, the impaired burst test signal 432 is passing through the FIR filter and the digital signal acquisition unit 416 may be triggered.

This triggering system has application for detecting breaks in shielding via the sheath integrity test method. In some locations when injecting sheath current, it may not be convenient to insert a burst trigger signal 244 into a tap or other insertion point because a tap is not located nearby.

FIG. 10 is a block diagram of a trigger generator 1000. The trigger generator is a burst test signal detector. The full bandwidth electrical return signal 440, which may be 0 to 42

MHz, is connected to an A-D converter input 1002 of an A-D converter 1004 which may be an Analog Devices AD9070 IC which is sampling at a rate of 100 Msamples/sec and producing 10 bits of data on each sample. It is assumed that the upstream laser receiver has a built-in low pass filter to prevent aliasing. If not, one will need to be supplied ahead of the A-D converter 1004. The 10 bits of data from the A-D converter 1004 are passed into a FIR filter 1006 which contains multiple unit delay elements such as a unit delay element 1008. FIR filter IC's may be purchased from ITT. The 10 bit signal is passed through the unit delay elements which are cascaded. The output from each unit delay element, such as a unit delay element output 1014 is passed into a digital multiplier such as a digital multiplier 1010. Each multiplier multiplies the unit delay element's output by a pre-programmed coefficient such as a coefficient 1012, which is a digital number. The coefficients are set to match the PN sequence used by the uinmpared burst test signal 434. Each multiplier generates an output such as a multiplier output 1016.

A summer 1018 adds all of the multiplier outputs and generates a digital sum signal 1020. This digital sum signal 1020 is the impulse response of the impaired burst test signal 432. It can also be used to generate a trigger signal if a positive magnitude comparator 1022 and a negative magnitude comparator 1024 are used. The positive magnitude comparator 1022 will detect a positive-going impulse, and the negative magnitude comparator 1024 will detect a negative-going impulse. The magnitude comparators are both comparing the digital sum signal 1020 with preprogrammed digital limits. If either the positive or negative limit is exceeded, a magnitude comparator generates a high voltage at its output An "or" gate 1026 will go high if either magnitude comparator generates a high voltage output An output from the "or" gate is a trigger 1028 can be used to trigger the digital signal acquisition unit 416. Likewise the digital sum signal 1020 is the desired impulse response which may be captured by a digital signal acquisition unit with a digital input, such as a logic analyzer, and downloaded by the digital signal processor 420 to compute the frequency response via an FFT.

The disadvantage to the circuit of FIG. 10 is high cost with current technology. The high cost is due to the high sampling rates and the large number of unit delay stages and digital multipliers. It may be advantageous to reduce the bandwidth by reducing the sampling rate to lower component cost. Thus the bandwidth of the trigger 1028 may be reduced from 42 MHz to 15–25 MHz. It may also be advantageous to reduce the cost by reducing the number of unit delay elements 1008 from 2048 to a smaller number such as 256. As the number of unit delay elements is reduced, the chance of a false trigger on noise or other signals goes up.

Summary Ramification and Scope

Although specific embodiments are disclosed for example herein, it is expected that persons skilled in the art can and will design alternative test system that are within the scope of the following claims either literally or under the Doctrine of Equivalents. In particular, the following enhancements and modifications are anticipated:

1. The size of the Fourier transform may be adjusted as desired for a longer time capture period or more resolution in the frequency domain.
2. The sampling rate may be increased. This will be necessary if the Nyquist rate is raised above 50 MHz.
3. The system described here can be used for many applications that require the complex frequency response to be measured, other than cable return systems. In particular, this system can drive a transformer to perform a sheath integrity test as described in the parent application.
4. Another application for the present system is to drive a return loss bridge, such as a Trilithic model RCB-3/75. This allows the return loss to be measured on an unknown device. Thus, the system can operate with a magnetic coupling device to measure the shield integrity of a span of cable and also operate with a return loss bridge to look inside the span of cable for the distance to a reflection.
5. Higher frequency ranges than the 5–42 MHz subsplit frequency range used in the United States can be accommodated. By increasing the clock frequency, increasing the corner frequency of the low pass filter, and increasing the sampling frequency on the digital signal acquisition unit, the frequency range can be increased.
6. Current displays show magnitude and phase as functions of frequency. Polar plots or 3-dimensional plots can also be used to display magnitude, phase and frequency.
7. The output of the software can be data files with magnitude, phase, group delay, impulse response, raw temporal data, and raw spectral data These data files can be put into a format compatible with spread-sheet computer programs.
8. Any type of burst test signal may be used. This includes the Koo signal invented by David Koo, quadratic chirps, stepped quadratic chirps as disclosed in the parent application, impulses, OFDM (orthogonal frequency division multiplexing) or any training signal with desirable properties that may be invented in the future.
9. In a system with multiple technicians testing at the same time, it is possible to differentiate at the headend which transmitter sent which burst. This can be done in two ways. The first is to use a different PN sequence for each technician's transmitter. The received signal is reported to have come from the unit with the best matching PN sequence to a set of stored unimpared reference signals. This can be done by performing a cross correlation between the received signal and each stored unimpared reference signal. The one that provides the highest amplitude on the impulse response is the matching unit Another way is to have different technicians use different frequencies for the burst triggers.
10. Although this patent disclosed a simple triggering system with a single tone providing the burst trigger signal, it is also possible to use other signal sources for triggering. These may include dual tones, or other unique signals. Other signal sources for triggering can provide better triggering reliability or more accurate timing at the expense of circuit complexity and cost.
11. The hardware platform for the digital signal processor may be a hand-held device, a desk top computer, or a lap-top computer.
12. The test system of the present invention tests an RF signal path with multiple channels at baseband. The test system may be used to test a higher frequency signal path, such as microwave, that is above the range of baseband techniques. This is done by connecting the transmitter device 201 to an upconverter. An output of the upconverter is connected to an RF signal path, and an output of the RF signal path is connected to an input of a downconverter. An output of the downconverter, which may produce both inphase (I) and quadrature (Q) outputs, is connected to the receiver system 402. Either double sideband, single sideband, or vestigial sideband modulation may be used by the upconverter and downconverter. The use of double sideband demodulation requires both I and Q data capture, which can be done on a digital oscilloscope using channel 1 input for I and channel 2 input for Q. Triggering may occur on the external trigger input.

13. The digital signal acquisition unit may be a digital storage oscilloscope, a scope card which plugs into a personal computer bus, such as models supplied by Gage, or an exterior module, such as may be purchased from Link Instruments.

14. The digital signal acquisition unit operating in the headend may automatically have its gain setting changed by the digital signal processor in response to being triggered by a signal that the digital signal processor finds to be too strong or too weak.

100 bi-directional cable system
102 downstream fiber optic cable
104 headend
106 fiber node
108 downstream laser transmitter
110 upstream laser receiver
112 downstream laser receiver
114 upstream laser transmitter
116 diplex filter
118 hard line coaxial cable
120 splitter/combiner
122 "
124 2-way amplifier
126 "
128 "
130 "
132 "
134 "
136 high pass section of diplex filter
138 low pass section of diplex filter
142 coaxial cable plant
140 tap
142 coaxial cable plant
144 house
146 drop cable
148 signal path
150 downstream signal path
152 remote point
154 upstream fiber optic cable
156 a remote signal insertion/extraction point
158 headend signal extraction point
160 headend signal insertion point
200 transmitter block diagram
201 transmitter device
202 digital circuit
204 digital burst trigger lead
206 digital burst test signal lead
208 momentary contact switch
210 amplifier
212 bandpass filter
214 1st tap port
216 equalizer
218 low pass filter
220 broadband amplifier
222 variable step attenuator
224 double pole triple throw switch
226 trigger plus notched burst test signal position
228 trigger plus burst test signal position
230 trigger only position
232 notch filter
234 burst test signal
236 digital burst trigger signal
238 digital burst test signal
240 1st terminating resistor
242 2nd terminating resistor
244 cburst trigger signal
246 2nd tap port
248 burst trigger signal lead
250 burst test signal lead
300 digital schematic diagram
302 clock oscillator
304 first flip-flop
306 second flip-flop
308 first shift resister IC
310 second shift register IC
312 third shift register IC
314 exclusive "or" gate
316 first "and" gate
318 second "and" gate
320 first counter IC
322 second counter IC
324 third counter IC
326 1-of-16 decoder
328 third flip-flop
330 fourth flip-flop
332 third "and" gate
334 fourth "and" gate
336 bus driver IC
342 fifth flip-flop
344 sixth flip-flop
346 initialize circuit
348 fifth "nand" gate
350 sixth "nand" gate
400 headend block diagram
402 receiver system
404 first headend splitter
406 second headend splitter
408 filter input lead
410 headend bandpass filter
412 trigger lead
414 broadband return signal line
416 digital signal acquisition unit
418 GPIB
420 digital signal processor
422 display
424 VGA to NTSC converter
426 modulator
428 television signal rf output
430 combiner network
432 impaired burst test signal
434 unimpaired burst test signal
440 electrical return signal
442 trigger circuit
444 trigger burst
500 software flow diagram
502 1st step
504 2nd step
506 3rd step
508 4th step
510 5th step
512 6th step
514 7th step
516 8th step 518 9th step
520 10 step
522 11th step
524 12th step
526 13th step
528 14th step
530 15th step
532 16th step
534 17th step
536 18th step
538 19th step
540 20th step
542 21st step
544 22nd step
546 23rd step
600 notched spectral plot
602 plot
604 hole
606 depth of the notch
608 notch frequency band
610 total frequency band
700 hardware block diagram
702 clock oscillator
704 1st pulse train
706 1st pn generator
708 1st pn output
710 driver amplifier
712 driver amplifier output
714 signal path
716 "nand" gate
718 2 input "nand" gate
720 2nd pulse train
722 2nd pn generator
724 amplifier
726 1st input lead
728 multiplier
730 2nd PN output
732 integrator
734 integrator discharge line
736 sample an hold circuit
738 sample-and-hold line
740 sample-and-hold output
742 impaired PN signal
744 2nd input lead
800 digital schematic diagram
804 shift register IC
806 shift register IC
808 "exclusive or" gate
810 shift register IC
812 shift register IC
814 "exclusive or" gate
816 "nand" gate
818 1st one-shot
820 2nd one-shot
822 "and" gate
900 receiver schematic diagram
902 input
904 minimum loss pad
906 amplifier stage
908 amplifier stage
910 double balanced mixer
916 IF output
918 operational amplifier
920 integrator resistor
922 integrator capacitor
924 charge dump switch
926 sample-and-hold capacitor
928 sample-and-hold switch
930 operational amplifier
932 highpass filter
1000 trigger generator block diagram
1002 A-D converter input
1004 A-D converter
1006 FIR filter
1008 unit delay element
1010 digital multiplier
1012 coefficient
1014 unit delay element output
1016 multiplier output
1018 summer
1020 digital sum signal
1022 positive magnitude comparator
1024 negative magnitude comparator
1026 "or" gate
1028 trigger

What I claim is:

1. A system for testing a signal path to produce a complex frequency response of the signal path, said system comprising:
a transmitter connected to a first location of the signal path, said transmitter for transmitting a predefined test signal, having a short duration, along the signal path;
a receiver connected to a second location of the signal path wherein the receiver receives the test signal as an impaired test signal;
a digital signal acquisition unit comprising a digital signal processor connected to the receiver, wherein the digital signal acquisition unit acquires the impaired test signal and processes the impaired test signal with an unimpaired test signal previously stored within the digital signal processor to produce the complex frequency response of the signal path between the first location and the second location.

2. The system of claim 1 wherein the signal path transports at least one other signal, and wherein the short duration of the test signal prevents uncorrectable disruption of the at least one other signal.

3. The system of claim 1 wherein the test signal comprises a pseudo-noise sequence.

4. The system of claim 1 wherein the test signal comprises a stepped frequency signal.

5. The system of claim 1 wherein the test signal comprises a Koo signal.

6. The system of claim 1 wherein the test signal comprises a chirp signal.

7. The system of claim 1 further comprising a notch filter connected between the transmitter and the signal path wherein the notch filter removes a predefined portion of the test signal, and further wherein the digital signal acquisition unit measures an amount of distorted signal within the predefined portion of the impaired test signal and when the amount of distorted signal exceeds a predetermined threshold value, the acquisition unit identifies the signal path as having clipping errors.

8. The system of claim 1 wherein said digital signal acquisition unit processes said impaired test signal with said unimpaired signal by converting each signal to a frequency domain set of coefficients and divides each coefficient of the impaired test signal by a corresponding coefficient of the unimpaired test signal to provide a set of frequency response coefficients.

9. The system of claim 1 wherein said digital signal acquisition unit converts the frequency domain set of coefficients into an impulse response by using an inverse discrete Fourier transform.

10. The system of claim 1 wherein said short duration of said test signal comprises a duration of less that 200 microseconds.

11. The system of claim 1 wherein said digital signal acquisition unit calculates a group delay as a rate of change of phase coefficients divided by a rate of change of frequency coefficients.

12. The system of claim 1 wherein said digital signal acquisition unit smooths the frequency response by averaging neighboring data coefficients.

13. The system of claim 1 wherein the test signal is upconverted to RF frequency before being transmitted and further wherein the received test signal is downconverted into the impaired test signal before being processed.

14. The system of claim 1 wherein the transmitter transmits a trigger signal with the test signal.

15. The system of claim 14 wherein the transmitter transmits no signal for a predetermined time after transmitting said trigger signal and before transmitting said test signal.

16. The system of claim 1 wherein said digital signal acquisition unit compares said impaired test signal to said unimpaired signal by performing a convolution between the unimpaired and the impaired burst to obtain the impulse response.

17. The system of claim 16 wherein said impulse response is transformed by a discrete Fourier transform to obtain the frequency response.

18. A system for testing a signal path to determine clipping of the signal path, said system comprising:
- a transmitter connected to a first location of the signal path, said transmitter for transmitting a predefined test signal, having a short duration, along the signal path;
- a notch filter connected between the transmitter and the signal path wherein the notch filter removes a predefined portion of the test signal;
- a receiver connected to a second location of the signal path wherein the receiver receives the test signal as an impaired test signal;
- a digital signal acquisition unit comprising a digital signal processor connected to the receiver, wherein the digital signal acquisition unit acquires the impaired test signal and processes the impaired test signal to measure an amount of signal present in the predefined portion of the test signal removed by the notch filter wherein clipping occurs when a predetermined amount of signal is present is the predefined portion of the test signal removed by the notch filter.

* * * * *